Aug. 10, 1971 A. ADDAMIANO 3,598,666
FORMATION OF JUNCTIONS IN SILICON CARBIDE
BY SELECTIVE DIFFUSION OF DOPANTS
Filed May 27, 1968

Inventor:
Arrigo Addamiano
by [signature]
His Attorney

United States Patent Office 3,598,666
Patented Aug. 10, 1971

3,598,666
FORMATION OF JUNCTIONS IN SILICON CARBIDE BY SELECTIVE DIFFUSION OF DOPANTS

Arrigo Addamiano, Willoughby, Ohio, assignor to General Electric Company

Filed May 27, 1968, Ser. No. 732,442
Int. Cl. H01l 7/62
U.S. Cl. 148—187 3 Claims

ABSTRACT OF THE DISCLOSURE

In subjecting n-type SiC to diffusion of boron and aluminum at high temperatures in order to create a p-type region, diffusion has been found not to take place where crystals overlap. By covering a silicon carbide crystal or platelet with pieces of silicon carbide crystals where diffusion is to be prevented and exposing the remainder, desired patterns or symbols can be created in the platelet which will light up when suitably contacted. Surface junctions may also be created in this way which will provide lines of light along the edges of the different regions.

CROSS-REFERENCES TO RELATED PATENTS

Pat. 3,458,779, issued July 29, 1969 to John M. Blank and Ralph M. Potter, entitled SiC P–N Junction Electroluminescent Diode with a Donor Concentration Diminishing from the Junction to One Surface and an Acceptor Concentration Increasing in the Same Region (similarly assigned) discloses and claims a light-emitting silicon carbide diode.

BACKGROUND OF THE INVENTION

The invention relates to light-emitting diodes of silicon carbide which are also referred to as solid state lamps. Such devices comprise a silicon carbide crystal or platelet containing a p-n junction. The n-type region of the crystal is nitrogen-doped and the p-type region is boron and/or aluminum doped. In the commercially available devices, a chip of such a crystal is mounted p-side down on a header and light is emitted through the n-type top side which is contacted by a fine wire.

In the present state of the technology of silicon carbide lamp making, green n-type platelets of alpha SiC doped with nitrogen are subjected to a diffusion process at high temperatures (2200° C.) to create a p-type layer. The dopants used for the p-type layer are boron and aluminum. The crystal or platelet is contained in a compartment within a porous carbon crucible during the diffusion process and under these circumstances the p-type layer forms on both flat sides and in fact encases the n-type crystal core. To make a light-emitting diode from the diffused crystal, the p-type layer is ground off on one side in order to expose the original n-type crystal bulk. A large area contact is then made to the p-layer, for instance by painting on it an aluminum-silicon resinate and heating to release the aluminum and silicon which form a shiny layer of Al-Si eutectic over the p-layer. Ohmic contact may be made to the n-side by fusing a gold-tantalum alloy dot to it to which a gold-wire may be bonded in the completed diode.

The p-layer is an integral part of the p-n junction structure and after the large area ohmic contact is made to it, the junction will emit light over its entire area when biased in the forward direction.

SUMMARY OF THE INVENTION

For some applications it is desirable that a portion of a crystal not emit light. In particular where symbols or indicia are to be displayed when the crystal lights, identifiable lines of light are required with some regions of the crystal remaining dark.

I have unexpectedly found that whenever two crystals happen to overlap during diffusion of boron and aluminum into alpha SiC, diffusion of the metal dopants does not take place into the zone of contact or very close approach of two crystals. The absence of diffusion is readily detected and evidenced by the absence of the room temperature luminescence which appears after boron diffusion. The yellow luminescence however is well visible in the zones of the crystal where no overlapping occurred.

This effect is particularly surprising when it is considered that the charge containing the boron and aluminum impurities is located outside and all around a crucible of porous carbon into which the alpha n-type SiC crystals were located. The diffusion therefore occurred through the carbon wall and is definitely connected with the creation of a finite though very small vapor pressure of B and Al over the crystals. That crystals in loose contact or merely very close to each other could effectively shield each other from the action of the vapors under such circumstances is therefore quite unexpected.

Utilizing this discovery, my invention provides a method of creating patterns in silicon carbide crystals by diffusion of dopants into selected zones and preventing the diffusion into other zones by covering or shielding them with a refractory non-porous material. Suitable refractory materials are pieces of silicon carbide, graphite and very refractory metals such as tungsten and tantalum. The carbides and silicides of tungsten and tantalum may also be used. Usually the most economical material to use are fragments of silicon carbide crystals which are unsuitable for manufacture into junction diodes.

DETAILED DESCRIPTION

Figure 1:
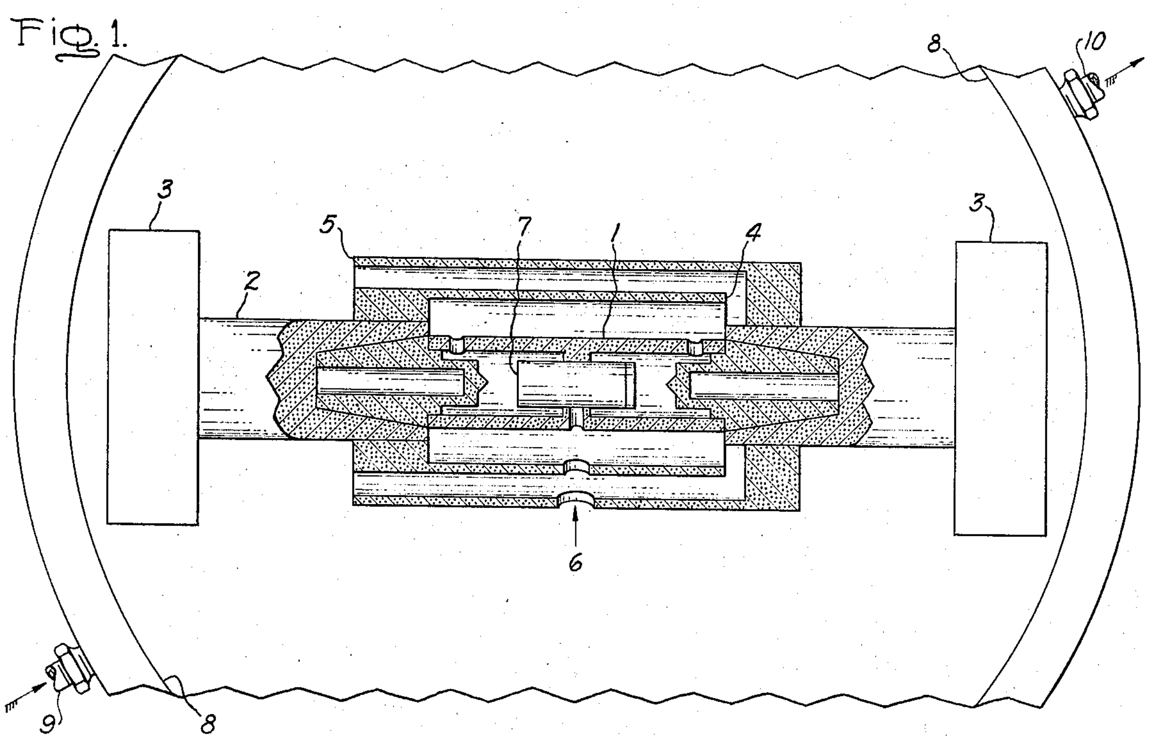
FIG. 1 is a diagrammatic illustration of a furnace apparatus suitable for selective diffusion of dopants into SiC crystals.

Referring to FIG. 1, a furnace suitable for formation of junctions in SiC by diffusion comprises a hollow graphite electric resistance heater 1 engaged between graphite current terminals 2 which in turn are engaged in massive water-cooled copper electrodes 3. Concentric graphite shields 4, 5 around the heater cut down the heat loss and a peephole 6 gives optical access for a pyrometer to a crucible 7 within the heater. The whole is located inside a double-walled chamber 8; the chamber may be evacuated and flushed with gas. The inlet and outlet for circulating cooling water through the walls are indicated at 9 and 10 respectively.

Figure 2:
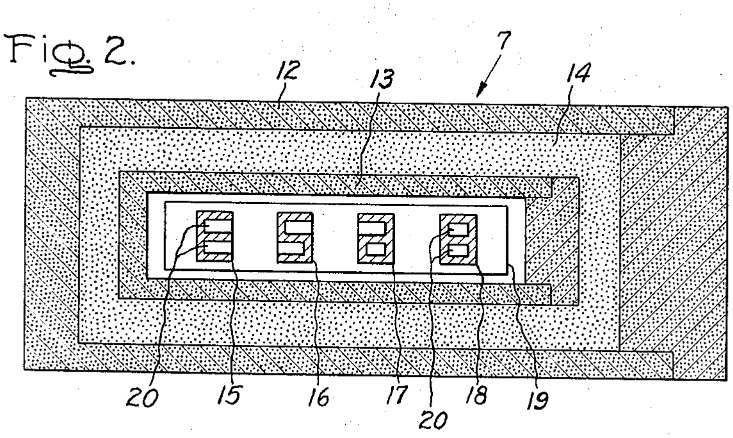
FIG. 2 is a plan cross section to a larger scale through the crucible assembly used with the furnace of FIG. 1.

The graphite crucible 7 centrally located within the heater is double-walled or consists of outer and inner vessels. As shown in FIG. 2, the outer vessel wall 12 of the crucible is made of dense graphite while the inner vessel wall 13 is made of porous graphite or carbon. A protective charge 14 of silicon and carbon with which are admixed the aluminum and boron dopants is located in the intramural cavity between outer and inner walls. Suitable proportions for the protective charge are silicon and carbon in stoichiometric proportions plus 0.1 atom percent Al and 0.1 mole percent $H_3BO_3$.

Figure 3:
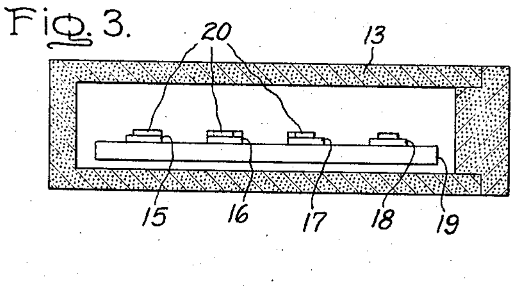
FIG. 3 is a cross section through the inner crucible only.

As illustrated in FIGS. 2 and 3, flat crystals or platelets 15 to 18 of silicon carbide have been placed on a graphite block 19 within the inner crucible. Each platelet consists of green nitrogen doped alpha SiC, suitably prepared by the Lely technique, then ground and polished with diamond paste as required to obtain plane surfaces perpendicular to the C axis and then cut to a rectangular shape. Small crystal chips 20 are carefully placed over each wafer and arranged to correspond to the dark areas in the patterns desired. The patterns in platelets 15 to 18 are reversed images of numerals 3, 2, 6 or 9, and 8 respectively, that is, the numerals appear normal when seen through the paper from behind.

Boron and aluminum are diffused into the crystal, preferably in accordance with the teachings of the aforementioned Blank and Potter application, in order to make a p-layer on the exposed surfaces. In a suitable procedure the furnace is first exhausted then filled with 15 p.s.i.g. of argon at room temperature. At the furnace operating temperature of approximately 2450° C., the argon pressure rises to about 45 p.s.i.g., that is an absolute pressure of about 4 atmospheres. The exposed surfaces of the crystals or platelets 15 to 18, that is the zones not overlapped by the crystal chips 20, show room temperature luminescence after diffusion. The exposed top surfaces of the chips 20 also show room temperature luminescence. The areas on the platelets which were shielded by the chips are perfect "shadows" of the chips when the platelets are subjected to 3650 A. ultraviolet excitation.

Various tests were made at 2450° C. in which the diffusion time was varied from a few minutes to as much as 5 hours in order to determine the degree or effectiveness of shielding. Remarkably, even after 5 hours no diffusion effects could be detected in the zones where a crystal or chip was shielding a platelet from the effect of the dopant vapors.

Besides pieces of SiC crystals, one may use for shielding dense very refractory materials which will not diffuse into SiC. Suitable materials are dense graphite, tungsten, tantalum and the carbides and silicides of tungsten and tantalum. In reusing a previously used piece of SiC, the same side should be exposed to the vapors. The side previously exposed has already absorbed some of the dopants which could diffuse out into the platelet if such side were placed in contact with the platelet.

With a diffusion temperature of 2200° C., an upper limit to diffusion at atmospheric pressure is reached due to thermal etching of the crystals. However by increasing the pressure of argon gas over the crystals, the temperature may be increased up to about 2600° C. without etching of the crystals resulting in a considerable saving in diffusion time. For instance, in diffusion at 2450° C., with argon pressure of 4 atmospheres absolute, 10 minutes is sufficient to produce a luminescent layer a few microns thick in the zones of the crystals not shielded from the vapors.

Figure 4:
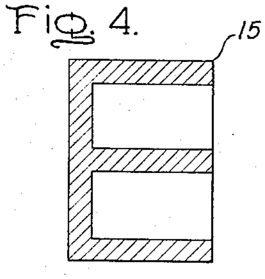
FIG. 4 is a greatly enlarged view of the p-side of a silicon carbide platelet in which a numeral 3 pattern has been diffused.

The zones where no diffusion occurs are electrically different from the diffused zones into which dopants were introduced and which luminesce under longwave ultraviolet excitation. Therefore junctions can be obtained by contacting different zones on the same face of the crystals or platelets, as well as opposite faces. Platelet 15 may be processed into a solid state lamp which will light up as the numeral 3. An area contact is made to the p-type zone shown crosshatched in FIG. 4, suitably by painting an aluminum-silicon resinate over that area. The platelet is then baked at a temperature sufficient to decompose the resin and create a shiny Al-Si eutectic layer on the surface. The platelet may then be conductively attached p-side down to a header, suitably through the use of a gold-filled epoxy cement applied to the Al-Si layer. Contact may be made to the n-type material anywhere on the n-side, suitably by fusing a gold-tantalum alloy in the form of a small dot to it and bonding a gold wire to the dot. Reference may be made to the aforementioned Blank and Potter application for the details of mounting the platelet on the header. Upon applying a negative potential to the n-side relative to the p-side, yellow light is created at the junction between the p-layer in the portions of the platelet where diffusion has taken place and the n-type bulk material. The light emerges through the n-type top side of the platelet which is desirable inasmuch as the n-type material is more transparent than the p-type.

Figure 5:
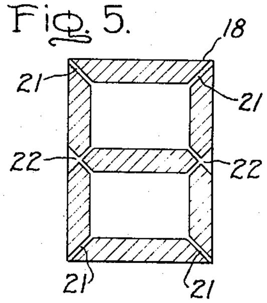
FIG. 5 is a view similar to FIG. 4 showing a numeral 8 pattern modified to make a numeric indicator.

Referring to FIG. 5, the pattern diffused into platelet 18 corresponds to numeral 8. By making diagonal cuts 21 at the corners and notches and cuts 22 at the midpoints of the long sides as shown, the numeral 8 pattern is broken up into seven segments in the conventional numeric design. By making a separate contact to each segment, the segments may be selectively energized to depict any numeral from 0 to 9.

Due to the good conductivity of n-type SiC, the contact to the n-type material may be made on either face of the crystal or platelet, that is to a region on the diffused face which was shielded, or to the opposite face. The invention thus provides a convenient method for creating surface junctions wherein both n and p-type contacts are on the same side of the platelet or crystal.

What I claim as new and desire to secure by Letters Patent of the United States is:

1. The method of creating lighting patterns in silicon carbide p-n junctions which comprises obtaining an n-type alpha SiC platelet, covering selected zones on one side of said platelet by placing a refractory non-porous material loosely thereon in order to prevent diffusion of p-type dopants into such zones, surrounding the SiC platelet with a protective charge providing the vapors of silicon and carbon corresponding to SiC and containing boron or aluminum dopants, heating to a temperature in the range from 1800° to 2600° C. in an inert atmosphere at a pressure sufficient to prevent pitting of the platelet surface and for a time sufficient to produce a p-region providing a p-n junction by inward diffusion of dopants into the platelet at the exposed areas thereof, and removing said refractory material.

2. The method of claim 1 wherein the refractory non-porous material consists of silicon carbide.

3. The method of claim 1 wherein adjacent p and n regions are respectively electrically contacted by electrically conductive means on said side of the platelet resulting in a surface junction.

References Cited

UNITED STATES PATENTS

| | | | |
|---|---|---|---|
| 3,451,867 | 6/1969 | Taft, Jr. et al. | 148—175 |
| 3,458,779 | 7/1969 | Blank et al. | 148—186 |
| 3,477,886 | 2/1967 | Ehlenberger | 148—187 |

L. DEWAYNE RUTLEDGE, Primary Examiner

R. A. LESTER, Assistant Examiner

U.S. Cl. X.R.

148—186, 189; 317—235, 237